United States Patent
Moyal et al.

[11] Patent Number: 6,140,880
[45] Date of Patent: Oct. 31, 2000

[54] CIRCUITS, ARCHITECTURES AND METHODS FOR DETECTING AND CORRECTING EXCESS OSCILLATOR FREQUENCIES

[75] Inventors: Nathan Y. Moyal, Austin; Mark J. Marlett, Georgetown; Steven C. Meyers, Round Rock, all of Tex.

[73] Assignee: Cypress Semiconductor Corp., San Jose, Calif.

[21] Appl. No.: 09/159,908

[22] Filed: Sep. 24, 1998

[51] Int. Cl.[7] ............................................. H03L 7/00
[52] U.S. Cl. ................................. 331/1 A; 331/17
[58] Field of Search ................... 331/1 A, 17; 327/155, 327/156, 5, 7

[56] References Cited

U.S. PATENT DOCUMENTS

| | | | |
|---|---|---|---|
| 4,646,031 | 2/1987 | Fast et al. | 331/25 |
| 4,996,444 | 2/1991 | Thomas et al. | 307/269 |
| 5,103,675 | 4/1992 | Komninos | 73/592 |
| 5,132,642 | 7/1992 | Bush et al. | 331/1 A |
| 5,138,281 | 8/1992 | Boudewijns | 331/1 A |
| 5,254,955 | 10/1993 | Saeki et al. | 328/155 |
| 5,331,296 | 7/1994 | Davis | 331/158 |
| 5,384,551 | 1/1995 | Kennedy et al. | 331/17 |
| 5,406,592 | 4/1995 | Baumert | 375/376 |
| 5,436,938 | 7/1995 | Pigeon | 375/376 |
| 5,592,113 | 1/1997 | Quiet et al. | 327/158 |
| 5,603,109 | 2/1997 | Feeney | 455/192.2 |
| 5,694,087 | 12/1997 | Ferraiolo et al. | 331/11 |
| 5,731,745 | 3/1998 | Parham | 332/123 |
| 5,761,055 | 6/1998 | Okada et al. | 363/16 |
| 5,774,799 | 6/1998 | Croft et al. | 455/192.2 |
| 5,896,066 | 4/1999 | Katayama et al. | 331/17 |

*Primary Examiner*—Robert Pascal
*Assistant Examiner*—Kimberly E Glenn
*Attorney, Agent, or Firm*—Christopher P. Maiorana, P.C.

[57] ABSTRACT

A circuit and method for preventing an oscillator from oscillating above a first predetermined frequency or below a second predetermined frequency. The present invention may comprise (a) a clock generation circuit configured to generate an output clock signal in response to (i) a reference clock, (ii) one or more control signals and (ii) a reset signal and (b) a control circuit configured to generate said reset signal in response to said one or more control signals.

16 Claims, 9 Drawing Sheets

CIRCUITS, ARCHITECTURES AND METHODS FOR DETECTING AND CORRECTING EXCESS OSCILLATOR FREQUENCIES

FIELD OF THE INVENTION

The present invention relates to voltage controlled oscillators generally and, more particularly, to a circuit and method for preventing a VCO runaway condition.

BACKGROUND OF THE INVENTION

Voltage controlled oscillators (VCOs) are used in phase lock loops (PLLs) to generate clocks having particular frequencies. PLLs are generally considered clock multipliers. For example, an input reference clock having a frequency of 10Mhz can be multiplied by the PLL to yield an output clock signal having a frequency of 100Mhz. Ideally, this clock multiplication would result in an output clock which is in perfect phase/frequency with the reference clock. However, a condition generally referred to as VCO "runaway" is a condition that can occur when the output of the VCO is running at such high speed that the PLL (typically the counters in the PLL) are not capable of operating at a sufficient speed to keep up with the VCO output clock signal. This condition can (and does) occur during power up and initial lock acquisition.

FIG. 1 illustrates a phase lock loop circuit 10 illustrating a conventional approach. The circuit 10 generally comprises a phase frequency detector (PFD) 12, a loop filter 14, a voltage controlled oscillator 16 and a divider 18. The VCO 16 presents a signal (i.e., VCO_CLK) to the divider 18. The divider 18 presents a feedback signal to the PFD 12. The PFD 12 also receives a reference clock (i.e., CLK). The difference in frequency between the reference clock CLK and the feedback signal is used to generate two control signals (i.e., PumpUP and PumpDN) that are presented to the loop filter 14. The loop filter 14 presents a voltage control signal to the voltage controlled oscillators in response to the control signals PumpUP and PumpDN. During normal operating conditions, the reference clock CLK is generally synchronized with the feedback signal. Such a synchronization is shown by the block 20.

An example of the runaway condition can be described using an example of an 800Mhz PLL 10 having a divider implementing divide-by-10 feedback counters and an 80Mhz reference clock CLK. When the PLL 10 is initially powered on, the control nodes (i.e., the input) of the VCO 16 are set to some arbitrary high voltage. In the example of a wide frequency range VCO 16, oscillations beyond a normal operating range could result. If the feedback counters of the divider 18 are designed to run at 800Mhz or below (either due to current consumption or structural limitations) the output of the feedback counter 18 may be unpredictable. The PLL 10 is likely to generate an output signal having a low frequency related to the underlying noise factors (perhaps in the 10Mhz range). Since the reference clock CLK presented to the PFD 12 is set to 80Mhz and the feedback signal is now oscillating at only 10Mhz, the PFD 12 will generate predominately PumpUP control signals to the loop filter 14. As a result, a further increase in the control nodes to the VCO 16 will occur, which results in the VCO 16 presenting the output clock signal VCO_CLK running at an even faster frequency.

In addition, the runaway condition can occur in the VCO 16 when the output clock signal VCO_CLK has a frequency that increases to the point where the feedback counters of the divider 18 fail. Alternately, in a case where the feedback from the VCO 16 is derived outside of the chip, a high load can "kill" the frequency of the feedback signal presented to the PFD, which causes a sequence of PumpUP control signals to be presented to the VCO 16.

(The ultimate effects of a VCO runaway condition are dramatic. When implemented in a typical PLL system (such as that shown in FIG. 1), a "lock-up" condition can occur which requires a hard reset to allow the VCO 16 to resume normal operation).

One conventional approach that may be used to reduce the effect of a VCO runaway condition may be to built a feedback counter (and the associated counters and logic) that can always keep up with the operating frequency of the VCO 16. However, to prevent the runaway condition, such logic and counters can be required to run a very fast speeds, which can draw high amount of current. Such a high speed, high current device may be impossible to implement if the VCO 16 is a CML derivative and the counters are implemented in CMOS technology. Additionally, such a solution continues to emphasize these drawbacks as operating frequencies continue to increase.

Another conventional approach is to place a voltage clamp on the control node (i.e., the input) of the VCO 16 that can track the process corners of the particular technology in which the PLL 10 is implemented. However, such as voltage clamp that can function over a wide variety of process corners can be difficult to design. If the clamp does not track the process corners adequately, a lock-up condition may still occur. As the overall frequency of oscillation of the PLL 10 increases, the difficulty in designing a voltage clamp that tracks a process corners increase.

SUMMARY OF THE INVENTION

The present invention concerns a circuit and method for preventing an oscillator from oscillating above a first predetermined frequency or below a second predetermined frequency. The present invention may comprise (a) a clock generation circuit configured to generate an output clock signal in response to (i) a reference clock, (ii) one or more control signals and (ii) a reset signal and (b) a control circuit configured to generate said reset signal in response to said one or more control signals.

The objects, features and advantages of the present invention include providing a circuit, method and architecture that may (i) track the VCO control currents, (ii) be implemented as a low current solution (e.g. less than 100$\mu$A), (iii) be implemented with standard circuit technology (e.g., CMOS), (iv) not rely on high speed logic, (v) be fully differential, (vi) operate independently maximum operating speed of the VCO, (vii) operate independently of the feedback counters maximum speed, (viii) be built introducing a minimum of additional noise sources placed on the sensitive nodes (e.g., by pumping down the PFD), and (ix) be built using a replica of the VCO which tracks the actual VCO process variations.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention is designed to be somewhat independent of the control voltage presented to a VCO. A sense circuit generally detects the voltage beyond the maximum functional control voltage to the VCO. As a result, the amount of over-design can be greatly improved. Once a reset is asserted (either to the PFD or the filter node), the reset generally stays on until a detect circuit senses the control nodes are at a low voltage level. This may be conceptualize as a detection with hysteresis.

Figure 1:
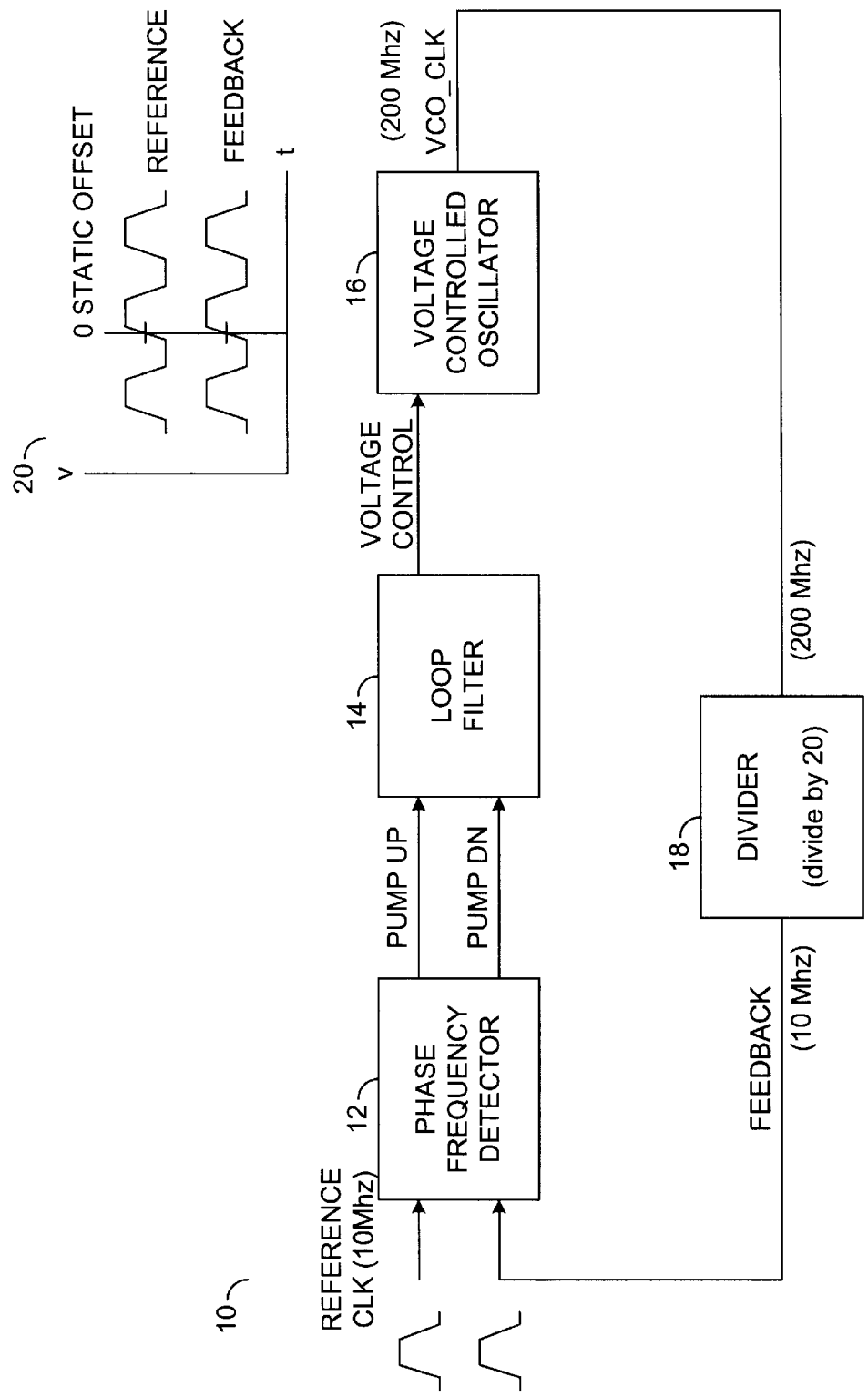
FIG. 1 illustrates a block diagram of a conventional VCO implemented in a PLL.
Figure 2:
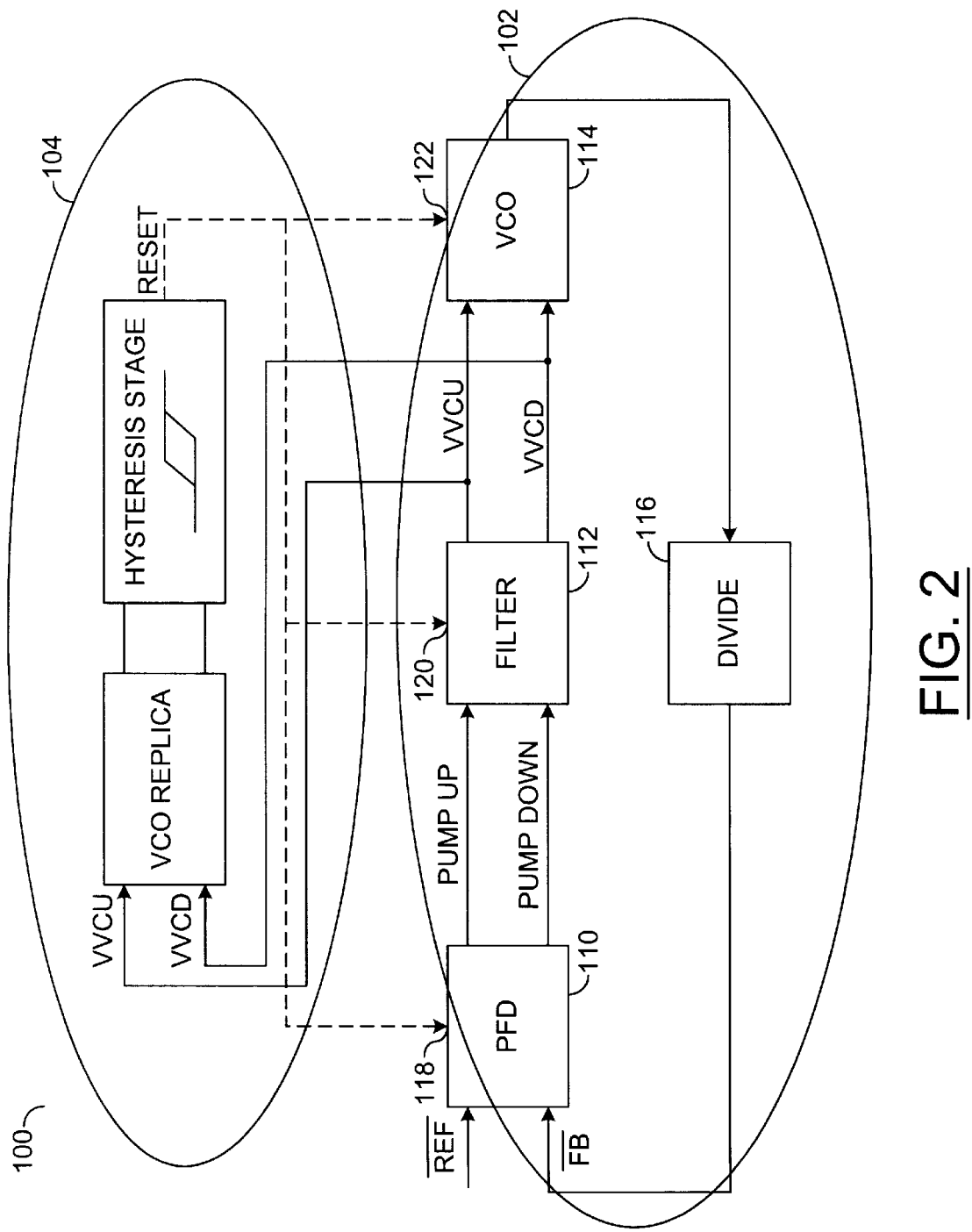
FIG. 2 illustrates a block diagram of a preferred embodiment of the present invention.

Referring to FIG. 2, a block diagram of a preferred embodiment of the present invention is shown. The circuit 100 generally comprises a PLL block (or circuit) 102 and a control block (or circuit) 104. The PLL block 102 generally comprises a PFD 110, a filter 112, a VCO 114 and a divide circuit 116, each of which may be similar to the PLL 10 described in connection with FIG. 1. However, the PFD 110, the filter 112 and the VCO 114 have an additional input 118, 120 and 122 that may receive a control (or reset) signal from control circuit 104. In one example, the reset signal may be presented to either of the PFD 110, the filter 112 or the VCO 114. In general, the VCO 114 resets when both comparators (to be described in detail in connection with FIG. 3) of the control block 104 are activated. At this point, the VCO 114 is already running beyond the maximum operating point of the VCO 114. The reset signal remains on until the control circuit 104 detects that the control nodes (or node) are at operating points at (or below) specification. At this point, the VCO 114 is running slow and the feedback is functioning properly.

Figure 3:
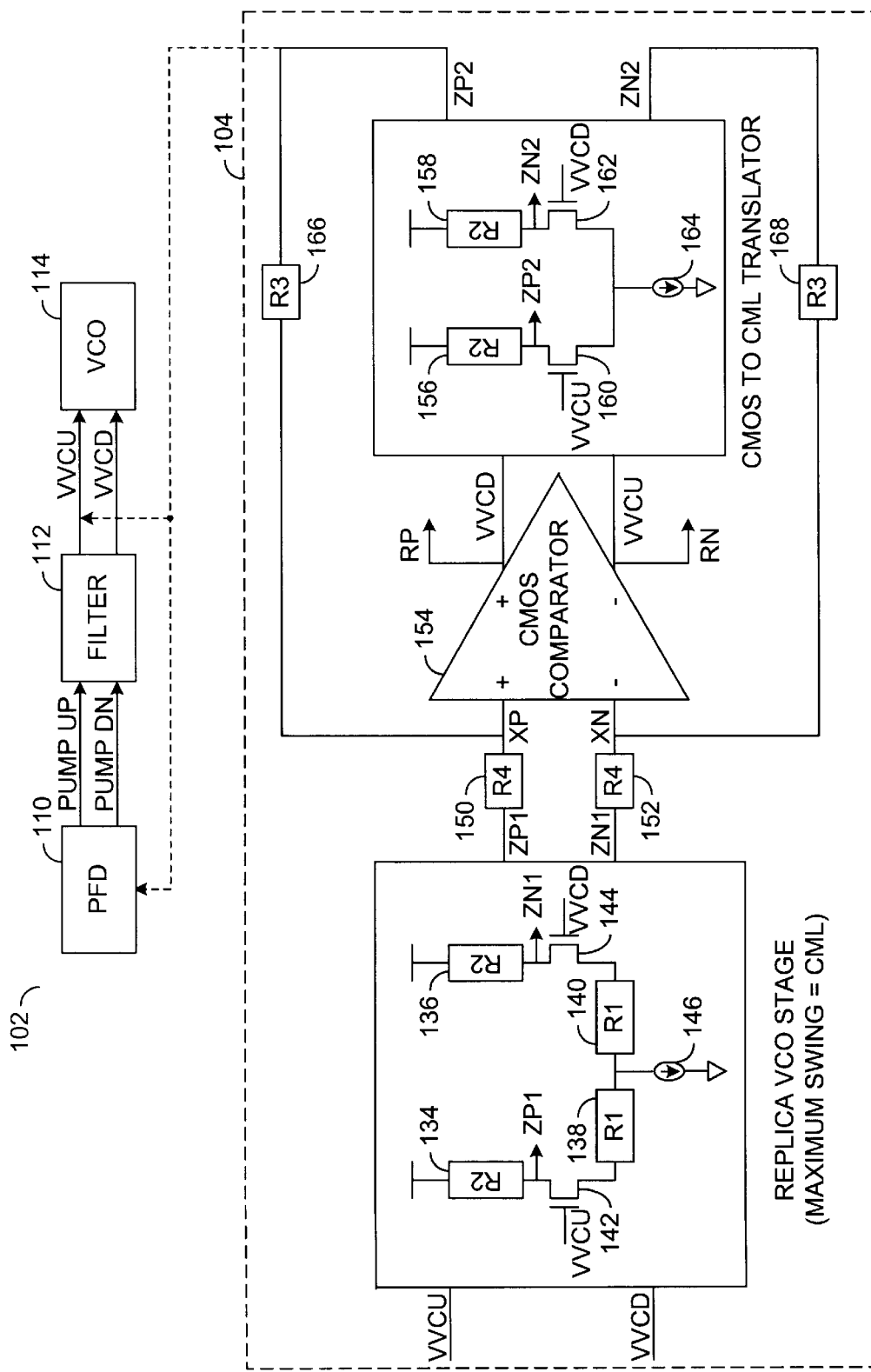
FIG. 3 illustrates a more detailed block diagram of the circuit of FIG. 2.

Referring to FIG. 3, a more detailed diagram of the circuit 100 is shown. The detect circuit 104 is shown comprising the replica stage 130 and a hysteresis stage 132. The replica stage 130 generally comprises a resister 134, a resister 136, a resister 138 and a resister 140. The resisters 134 and 136 generally have a similar resistance value (e.g., R2) and the resisters 138 and 140 generally have a similar resistance value (e.g., R1). The replica stage 130 may also comprise a transistor 142, a transistor 144, and a current source 146. The transistor 142 generally receives a signal (e.g., VVCU) and the transistor 144 generally receives a signal (e.g., VVCD). The resistor 134 is generally coupled between a supply voltage (e.g., VCC) and a source of the transistor 142. The drain of the transistor 142 is generally connected to the current source 146, through the resistor 138. The source of the transistor 142 generally presents a control signal (e.g., ZP1) used by the hysteresis section 132. The resistor R2 is generally coupled to a source of the transistor 144, which may present a control signal (e.g., ZN1) used by the hysteresis section 132. The drain of the transistor 144 is generally coupled, through the resistor 140, to the current source 146. The gate of the transistor 144 may receive the control signal VVCD. In certain design applications (e.g., CMOS technology), the sources and drains of the transistors 142 and 144 may be inverted.

The hysteresis block 132 generally comprises a resistor 150, a resistor 152, a comparator 154, a resistor 156, a resistor 158, a transistor 160, a transistor 162 and a current source 164. A control signal (e.g., XP) may be presented to the VCO block 102 through a resistor 166. The resistors 156 and 158 generally have a similar resistance (i.e., R2) as the resistance of the resistors 134 and 136. The resistors 150 and 152 generally have a similar resistance (e.g., R4). The resistors 166 and 168 generally have a similar resistance (e.g., R3). In certain design applications, the resistors 150 and 152 may be eliminated. In such a design application, the resistors 134 and 136 may provide a resistance to the comparator 154.

The comparator 154 generally has a positive input that may receive the control signal XP from the resistor 150 and/or the resistor 166 and a negative input that may receive a control signal (e.g., XN) from the resistor 152 and/or the resistor 168. The comparator 154 has a positive output that generally presents the signal VVCD and a negative output that generally presents the signal VVCU. The transistor 160 generally has a gate that receives the signal VVCU and the transistor 162 generally has a gate that receives the signal VVCD. The resistor 156, the resistor 158, the transistor 160, the transistor 162 and the current source 146 are generally connected in a similar fashion as the components of the block 130.

The replica circuit 130 generally implements a gain (e.g., replica VCO gain). The replica circuit 130 may generate the signals ZP1 and ZN1, which generally track the amount of current steering on the actual VCO 114. In general, the larger the voltage difference between the signal VVCU and the signal VVCD, the larger the differential swing on the signals ZP1 and ZN1. The resistors 134, 136, 138 and 140 may be considered degeneration resistors, which may be used to lower the gain of the replica block 130. It may be desirable to size the resistors 138 and 140 greater than the degeneration resistors 134 and 136 to ensure that the amount of current stir in the first stage is proportional, but lower, than the amount of current stir in the actual VCO stage. However, in may be desirable to size the resistors 134, 136, 138 and 140 equally in certain design applications.

The comparator 154 may be implemented, in one example, as a CMOS-to-CML comparator. The comparator 154 may be used to translate the comparator output to an amplitude signal which may be consistent with the stage 130, which may be implemented using CML logic.

The node RP may be high (and the node RN may be low) when the difference between the signal VVCU and VVCD is greater than a first (e.g., high) trigger point. The first trigger point may be sized appropriately to meet the design criteria of a particular implementation. In one example, the first trigger point may be when the difference between the signal VVCU and VVCD is 1 volt. Additionally, a second (e.g., low) trigger point may be implemented and may occur when the difference between the signal VVCU and VVCD is equal to −1V. The high and low trigger points may be values used by the hysteresis. The hysteresis may be refined by the amount of resistor degeneration in the first stage (e.g. R1) and the ratio of the resistance R3 and R4. More hysteresis may be added by either increasing the resistance R1 or increasing the ratio of the resistances R3/R4. By altering the resistance ratio R3/R4, the self-hysteresis is also altered. If the signal ZP1 is low and the signal ZP2 is high, and the signal ZN1 is high while the signal ZN2 is low, then for the signal XP2 to equal the signal XN, the signal ZP1 generally increases (and the signal ZN1 generally decreases), beyond some threshold which set by the resistor ratio R3/R4.

Figure 4:
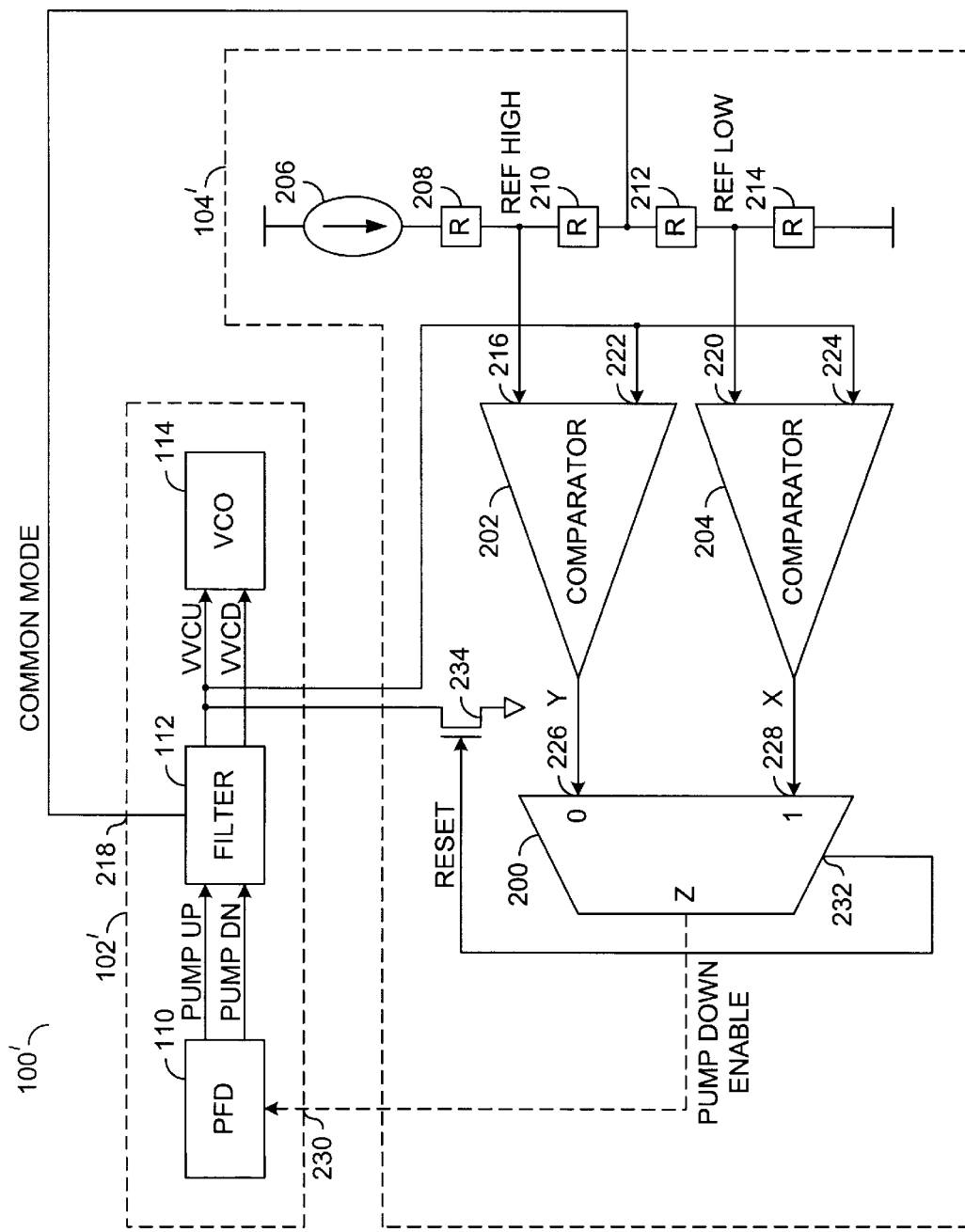
FIG. 4 illustrates an alternate embodiment of the present invention.

Referring to FIG. 4, an alternate embodiment of the circuit 100' is shown where the control block 104' is implemented with alternate logic. The control block 104' is shown comprising a multiplexer 200, a comparator 202, a comparator 204, a current source 206, a resistance 208, a resistance 210, a resistance 212, and a resistance 214. A node between the resistance 208 and the resistance 210 may generate a signal (e.g., REF_HIGH) that may be presented to an input 216 of the comparator 202. A node between the resistance 210 and the resistance 214 may generate a signal (e.g. COMMON_MODE) that may be presented to an input 218 of the PLL block 102. A node between the resistance 212 and the resistance 214 may generate a signal (e.g., REF_LOW) that may be presented to an input 220 of the comparator 204. An input 222 of the comparator 202 may receive the signal VVCU, from the filter 112. An input 224 of the comparator 204 may receive the signal VVCD, from the filter 112. The comparator 202 may present a signal (e.g., Y) and the comparator 204 may present a signal (e.g., X) to an input 226 and an input 228 of the multiplexer 200, respectively. The multiplexer 200 may present a signal (e.g., Z) that may be an enable signal (e.g., PUMP_DOWN_ENABLE) to an input 230 of the PLL block 102'. The following TABLE 1 illustrates the overall logic function of the control block 104':

TABLE 1

| Zo | X | Y | Zn | |
|----|---|---|----|---|
| 0 | 0 | 0 | 0 | ok |
| 0 | 0 | 1 | 1 | not possible |
| 0 | 1 | 0 | 0 | ok (normal) |
| 0 | 1 | 1 | 1 | Reset |
| 1 | 0 | 0 | 0 | back to normal |
| 1 | 0 | 1 | 0 | not possible |
| 1 | 1 | 0 | 1 | continue reset |
| 1 | 1 | 1 | 1 | continue reset |

Zo = original
Zn = new

The signal Zo may represent the original value presented by the multiplexer 200 and the signal Zn may represent the new value presented by the multiplexer 200. An output 232 of the multiplexer 200 may present a control signal (e.g., RESET) to the gate of a transistor 234. In general, the signal X and the signal Y are high when reference frequency REF is greater than the signal VVCU.

Figure 5:
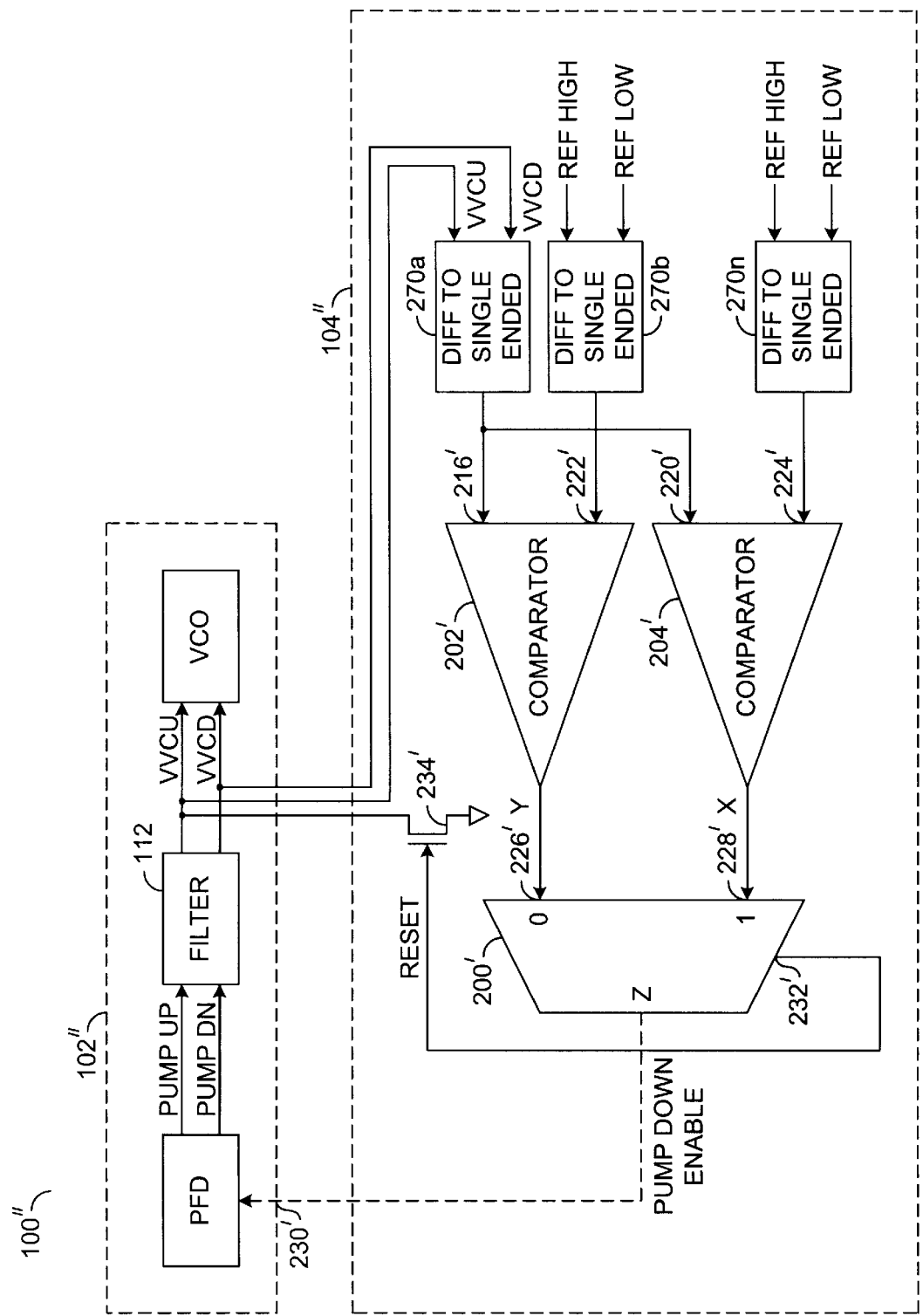
FIG. 5 is a second alternate embodiment of the present invention.

Referring to FIG. 5, a circuit 100" is shown comprising a PLL section 102" and a control section 104". The circuit 100" may be similar to the circuit 100'. However, there is not generally a common mode input to this filter block 112. Additionally, the current source 206, the resistance 208, the resistance 210, the resistance 212, and the resistance 214 are generally supplemented with a number of differential to single ended conversion circuits 270a–270n. Each of the conversion circuits 270a–270n may be constructed similarly to the control block 104 shown in FIG. 3.

Figure 6:
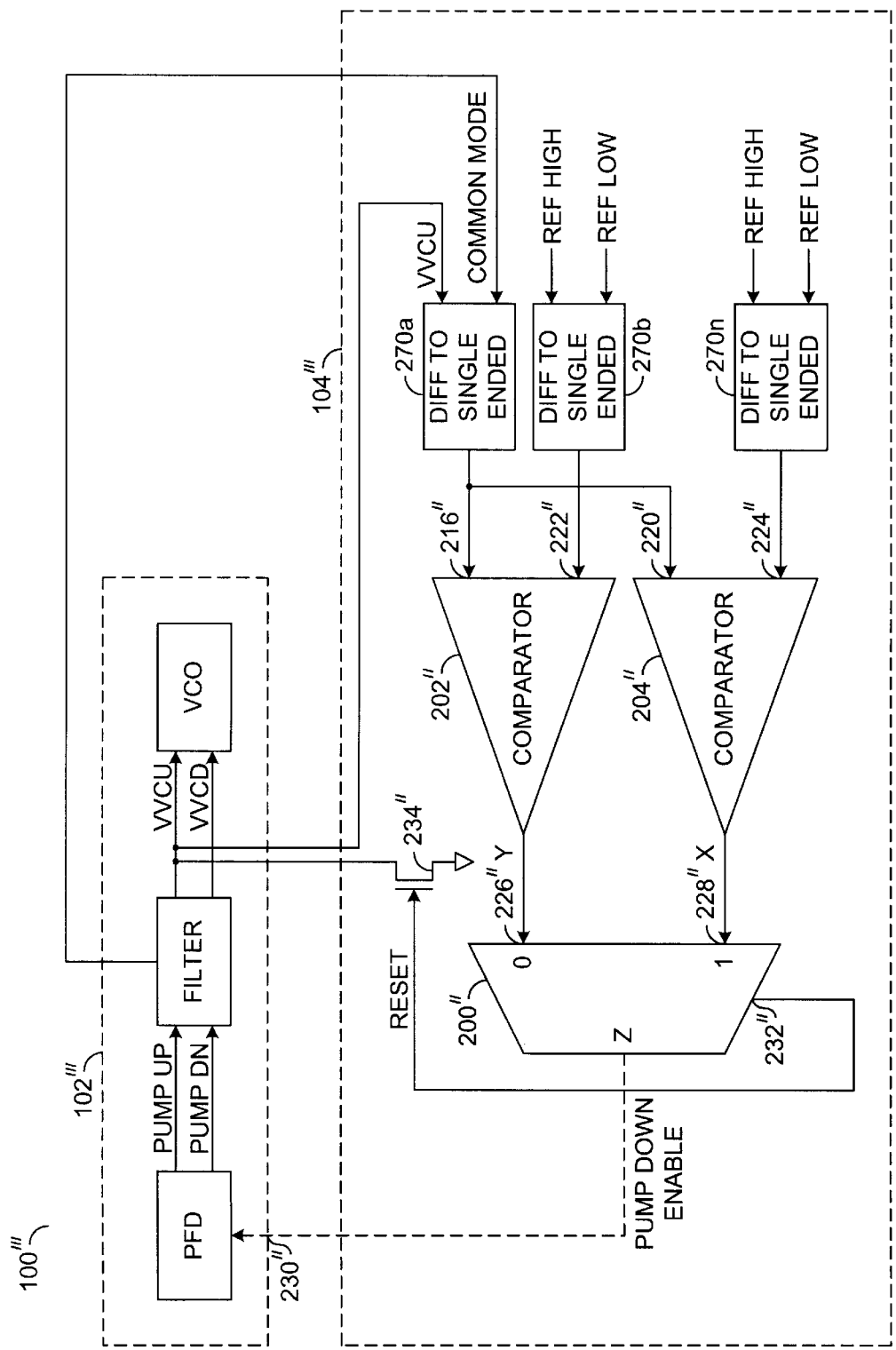
FIG. 6 is a third alternate embodiment of the present invention.

Referring to FIG. 6, a circuit 100''' is shown having similar features as in circuit 100". However, the differential to single ended circuits 270a–270n may use a common mode signal as one of the reference inputs.

Figure 7:
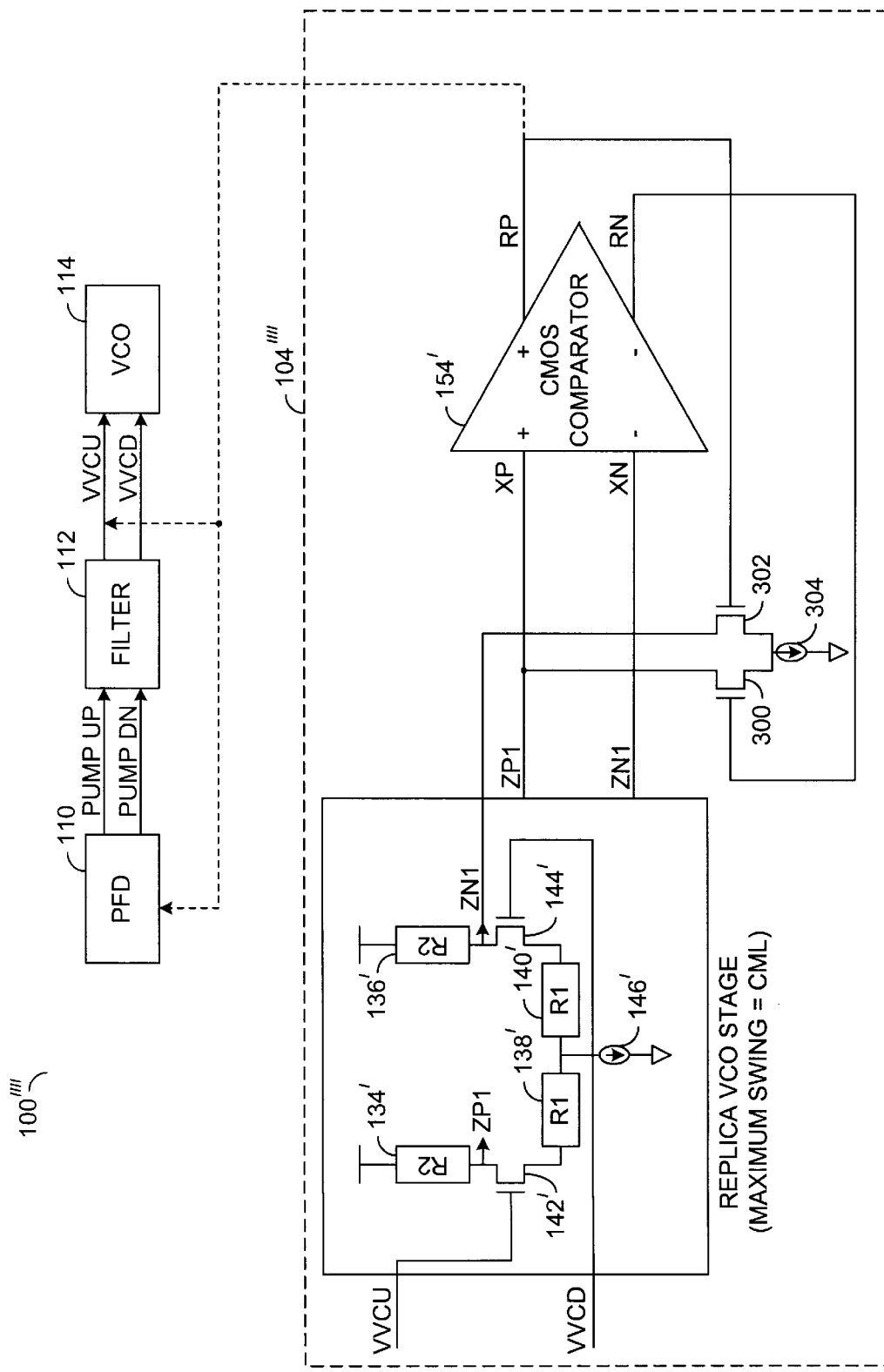
FIG. 7 is an fourth alternate embodiment of the present invention illustrating an alternate hysteresis.

Referring to FIG. 7, a circuit 100"" is shown implementing an alternate control block 104"". The resistances 134', 136', 138' and 140', as well as the transistor 142', the transistor 144' and the current source 146' may be similar to the components shown in FIG. 3. A transistor 300 and a transistor 302 are shown receiving the output signals RP and RN, respectively, from the comparator 154'. The drains of the transistors 300 and 302 are generally connected to ground through a current source 304. The sources of the transistors 300 and 302 generally receive the signals ZP1 and ZN1, respectively.

Figure 8:
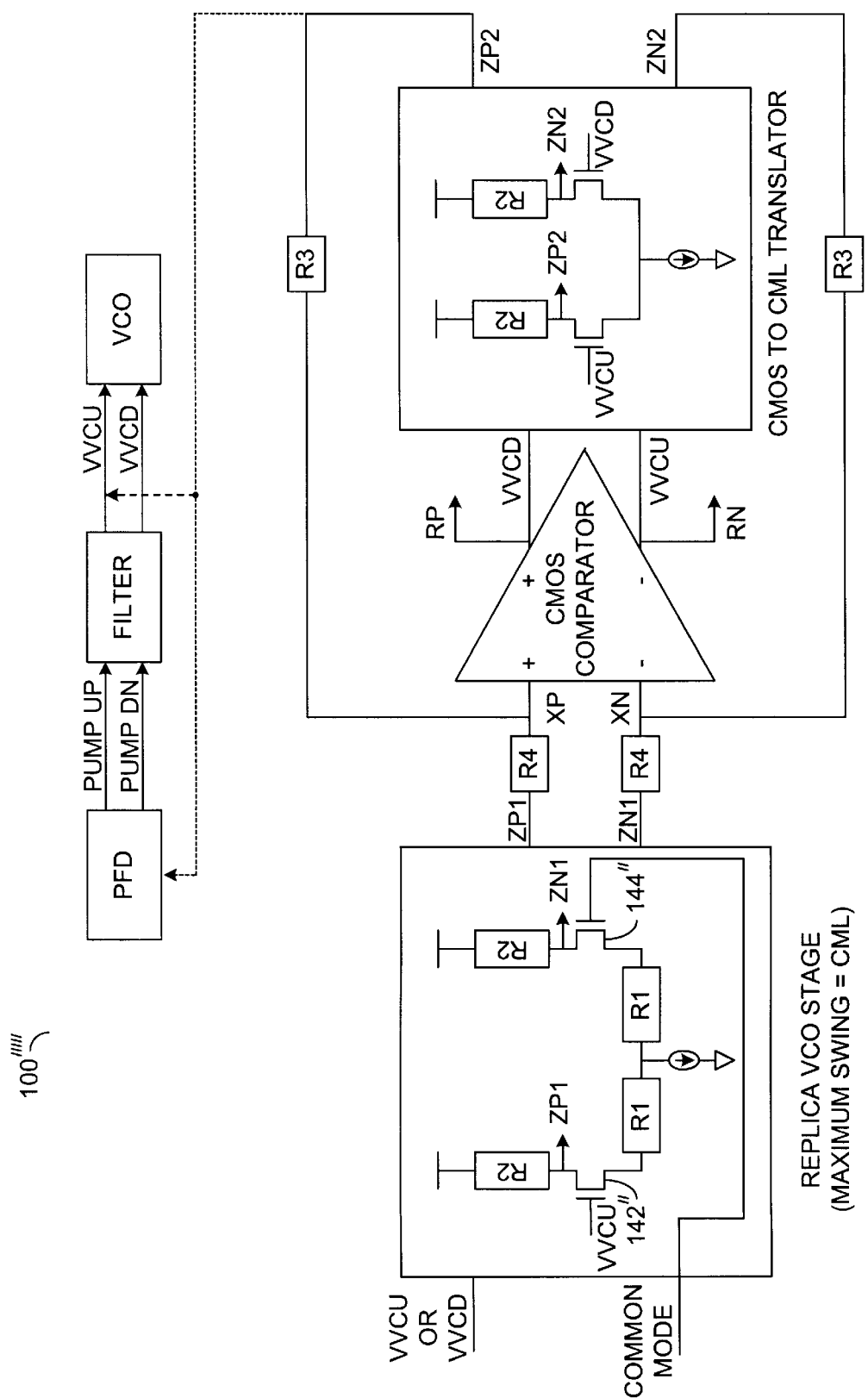
FIG. 8 is a fifth alternate embodiment of the present invention illustrating a common mode replacing one of the filter nodes.

Referring to FIG. 8, a circuit 100""' is shown having a common mode signal replacing one of the filter nodes. The common mode signal may be presented to either the transistor 142" or the transistor 144". As a result, only one of the signals (either VVCU or VVCD) is generally presented to the other transistor 142" or 144".

Figure 9:
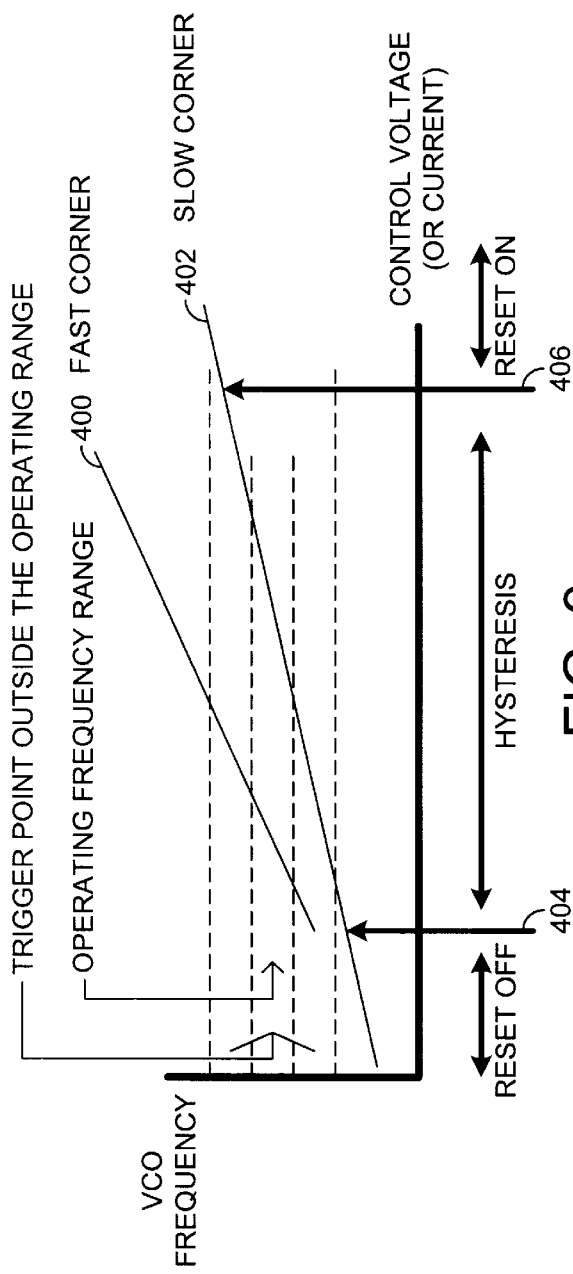
FIG. 9 is a diagram illustrating the trigger points of the present invention.

Referring to FIG. 9, a graph of the operation of the present invention is shown. A line 400 generally illustrates a fast process corner while a line 402 generally illustrates a slow process corner. The x-axis generally represents the VCO operation frequency and the y-axis generally represents the control voltage (or current). A line 404 generally represents a control voltage where the reset signal is an "off" (or disabled) state. A line 406 generally represents a time when the reset signal is in an "on" (or enabled) state. Between the time represented by the line 404 and the line 406, the hysteresis described in connection with FIG. 3 generally occurs.

Figure 10:
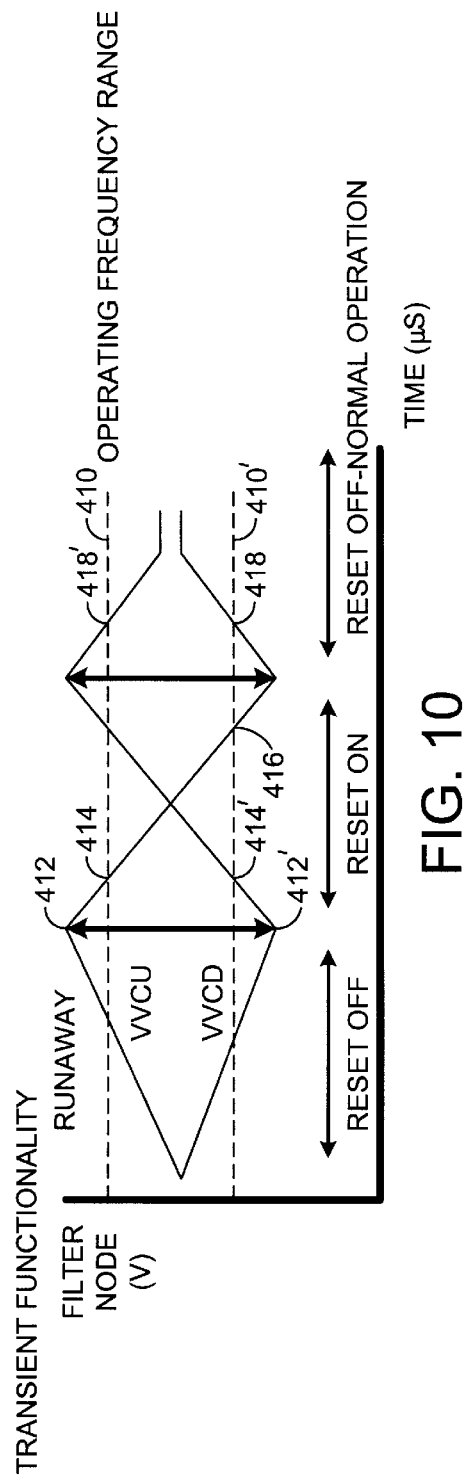
FIG. 10 is a diagram illustrating the transient functionality of the present invention.

Referring to FIG. 10, a diagram illustrating the transient functionality of the present invention is shown. The x-axis generally represents a time domain and the y-axis generally represents the voltage on the filter node. When the voltage on the filter node increases above a line 410, such a during the peak 412, a runaway condition generally occurs. However, the present invention detects such a runaway condition (while it may still be correctable) and starts to reduce the operating frequency of the VCO 114 until the operating frequency is within the normal operating frequency range (e.g., at the point 414). If the frequency drops below the operating frequency range 410', such as at the point 416, the present invention again operates to avoid the runaway frequency and begins to increase the operating frequency until the point 418. As a result, the present invention avoids the runaway condition without resorting to a reset.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a voltage controlled oscillator circuit configured to generate an output clock signal in response to (i) one or more control signals and (ii) a resist signal a reset;
    a phase frequency detector configured to generate said one or more control signals in response to (i) a reference clock and (ii) said output clock signal; and
    a control circuit configured to generate said reset signal in response to said one or more control signals wherein preventing a VCO runaway condition.

2. The circuit according to claim 1, wherein said circuit comprises a phase-locked loop.

3. The circuit according to claim 1, wherein said control circuit comprises:
   an input circuit configured to generate a first and a second control signal in response to (i) said one or more control signals and (ii) one or more resistors;
   a comparator circuit configured to generate a third control signal and a fourth control signal in response to said first and second control signals; and
   an output circuit configured to generate said reset signal in response to said third and fourth control signals.

4. The circuit according to claim 3, wherein said comparator circuit generates said third and fourth control signals in further response to said reset adjust signal and a complement of said adjust signal.

5. The circuit according to claim 1, wherein said reset signal is presented to said phase frequency detector.

6. The circuit according to claim 1, further comprising a filter circuit coupled between said phase frequency detector and said voltage controlled oscillator.

7. The circuit according to claim 6, wherein said reset signal is presented to said filter circuit.

8. The circuit according to claim 1, wherein said reset signal is generated in response to said output clock signal oscillating above a first predetermined frequency.

9. The circuit according to claim 8, wherein said first predetermined frequency is a function of a ratio defined by a first one of a plurality of resistors divided by a second one of a plurality of resistors.

10. The circuit according to claim 1, wherein said reset signal is generated in response to said output clock signal oscillating below a second predetermined frequency.

11. The circuit according to claim 1, wherein said control circuit comprises:
    an input circuit configured to generate a first and a second control signal in response to (i) said one or more control signals and (ii) one or more resistors;
    a first comparator configured to generate a first comparator signal in response to (i) said one or more control signals and (ii) one of said first and second control signals;
    a second comparator configured to generate a second comparator signal in response to (i) said one or more control signals and (ii) one of said first and second control signals; and
    a multiplexer circuit configured to generate an said reset signal in response to said first and second comparator signals.

12. The circuit according to claim 11, further comprising one or more differential to single ended converter circuits each configured to receive (i) said one or more control signals and (ii) one or more of said first and second control signals.

13. The circuit according to claim 12, wherein one of said converter circuits receives a common mode signal.

14. The circuit according to claim 13, wherein said input circuit receives said common mode signal.

15. A circuit comprising:
    oscillator means for generating an output clock signal in response to (i) one or more control signals and (ii) a reset signal;
    means for generating said one or more control signals in response to (i) a reference clock and (ii) said output clock signal; and
    means for generating said reset signal in response to said one or more control signals wherein preventing a VCO runaway condition.

16. A method for preventing an oscillator from oscillating above a first predetermined frequency or below a second predetermined frequency comprising the steps of:
    (A) generating an output clock signal with an oscillator in response to (i) one or more control signals and (ii) a reset signal;
    (B) generating said one or more control signals in response to (i) a reference clock and (ii) said output clock signal; and
    (C) generating said reset signal in response to said one or more control signals.

* * * * *